US006569719B2

(12) United States Patent
Miyazaki et al.

(10) Patent No.: US 6,569,719 B2
(45) Date of Patent: May 27, 2003

(54) SEMICONDUCTOR DEVICE AND METHOD FOR PRODUCING THE SAME

(75) Inventors: Minoru Miyazaki, Hokkaido (JP); Akane Murakami, Kanagawa (JP); Satoshi Teramoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 120 days.

(21) Appl. No.: 09/782,299

(22) Filed: Feb. 14, 2001

(65) Prior Publication Data

US 2001/0044196 A1 Nov. 22, 2001

Related U.S. Application Data

(62) Division of application No. 08/635,283, filed on Apr. 19, 1996, now Pat. No. 6,201,281, which is a continuation of application No. 08/270,773, filed on Jul. 5, 1994, now abandoned.

(30) Foreign Application Priority Data

Jul. 7, 1993 (JP) .............................. 5-192829

(51) Int. Cl.[7] .............................................. H01L 21/00
(52) U.S. Cl. ...................................................... 438/149
(58) Field of Search ................................. 438/149, 151, 438/164, 197

(56) References Cited

U.S. PATENT DOCUMENTS

| 3,855,112 A | 12/1974 | Tomozawa et al. |
| 4,570,328 A | 2/1986 | Price et al. |
| 4,646,426 A | 3/1987 | Sasaki |
| 4,707,721 A | 11/1987 | Ang et al. |
| 4,755,478 A | 7/1988 | Abernathey et al. |

(List continued on next page.)

FOREIGN PATENT DOCUMENTS

| JP | 61-183971 | 8/1986 |
| JP | 2-295111 A | 12/1990 |
| JP | 04-11722 A | 1/1992 |
| JP | 04-058564 A | 2/1992 |
| JP | 04-101453 A | 4/1992 |
| JP | 0 502 749 A2 | 9/1992 |
| JP | 04-360580 A | 12/1992 |
| JP | 05-114724 A | 5/1993 |
| JP | 05-299655 A | 11/1993 |
| JP | 06-013615 A | 1/1994 |

OTHER PUBLICATIONS

S.K. Ghandhi, VLSI Fabrication Principles, pp. 486, 498, 525.
S. Wolfe, Silicon Processing for the VLSI Era, vol. 2, pp. 104–105, 124–133, 194–196, 271–273.
J–M Hwang et al., IEDM '92, p. 345 "Novel Polysilicon/TiN Stacked–Gate. . . SO1/CMOS".
M. Wittmer et al., Thin Solid Films, 93(1982) 397 "Applications of TiN thin films. . . ".
M. Wittmer, et al., J. Appl. Phys., 54(3) (1983) 1423, "Characteristics of TiN gate MOSEFTs".

Primary Examiner—Wael Fahmy
Assistant Examiner—Aneta Cieslewicz
(74) Attorney, Agent, or Firm—Nixon Peabody LLP; Jeffrey L. Costellia

(57) ABSTRACT

In the production of thin film transistor (TFT), a gate insulating film is formed to cover an active layer, a titanium nitride film is formed on the gate insulating film, and an aluminum film used as the gate electrode is formed on the titanium nitride film. The resulted configuration prevents the etching of the aluminum film from the insulating film side even if the etchant of aluminum enters the recessed portion at the edge of the active layer during the patterning of the gate electrode. Also in the anodizing process, when an oxide film is formed on the surface of the aluminum film, the oxidation of aluminum from the gate insulating film side is prevented even when the electrolyte solution enters the recessed portion at the edge of the active layer.

12 Claims, 4 Drawing Sheets

U.S. PATENT DOCUMENTS

| | | |
|---|---|---|
| 4,931,411 A | 6/1990 | Tigelaar et al. |
| 5,141,897 A | 8/1992 | Manocha et al. |
| 5,166,086 A | 11/1992 | Takeda et al. |
| 5,177,577 A | 1/1993 | Taniguchi et al. |
| 5,240,868 A | 8/1993 | Bae et al. |
| 5,245,207 A | 9/1993 | Mikoshiba et al. |
| 5,252,502 A | 10/1993 | Havemann |
| 5,308,998 A | 5/1994 | Yamazaki et al. |
| 5,366,912 A | 11/1994 | Kobayashi |
| 5,470,762 A | 11/1995 | Codama et al. |
| 5,478,766 A | 12/1995 | Park et al. |
| 5,498,573 A | 3/1996 | Whetten |
| 5,576,225 A | 11/1996 | Zhang et al. |
| 5,604,137 A | 2/1997 | Yamazaki et al. |
| 5,614,732 A | 3/1997 | Yamazaki |

SEMICONDUCTOR DEVICE AND METHOD FOR PRODUCING THE SAME

BACKGROUND OF THE INVENTION

1. Field of the Invention

This invention relates to an insulated gate field effect semiconductor device using a thin film semiconductor and a method for producing the same.

2. Description of the Related Art

A known structure of an insulated gate field effect transistor using a thin film semiconductor (hereinafter referred to simply as "TFT") is shown in FIG. 2D. The method for producing such TFT is described below with reference to FIGS. 2A to 2D.

A base film (silicon oxide film) 22 is formed on a glass substrate 21 at a thickness of approximately 2000 Å. On the base film 22, a silicon semiconductor layer 23 having amorphous or crystalline structure is formed as an active layer (where source/drain regions and a channel forming region are formed) at a thickness of about 1000 Å to obtain the shape shown in FIG. 2A. An element separation patterning is performed to obtain a shape shown in FIG. 2B. During this patterning, it is difficult to etch only the active layer 23, and the base film 22 is also etched to some extent. As a result, a recessed portion 24 occurs on the base film 22.

A silicon oxide film 26 as the gate insulating film is formed at a thickness of approximately 1000 Å. As seen in FIG. 2C, however, the film 26 also generates a recessed portion 27. FIG. 4 is a cross section TEM photograph corresponding to the shape shown in FIG. 2C. The photograph represents the state of thin film at the recessed portion 27 where a concave strip appears to form a notch.

After this etching, an aluminum film 28 is formed at a thickness of 6000 Å, and the film 28 is patterned to form a gate electrode. Then an anodizing treatment is given to the patterned electrode to form an oxide layer 29 at a thickness of 2000 Å. FIG. 2D shows the A–A' cross section of FIG. 2C. As illustrated in FIG. 2D, the aluminum film 28 is patterned to form the gate electrode. FIG. 3 is a schematic drawing of a plan view of a TFT shown in FIG. 2C or FIG. 2D. The C–C' cross section of FIG. 3 corresponds to FIG. 2D, and the B–B' cross section corresponds to FIG. 2C. The reference numbers 30 through 32 in FIG. 3 are the contact electrodes, though they are not shown in FIG. 2C and FIG. 2D.

A problem of such TFT is that the presence of recessed portion 27 causes substantial break of the gate electrode and the gate wiring 28. The breaking is presumably caused by the following phenomena.

1. The patterning of the gate electrode 28 made of aluminum is preferably conducted by a selective etching using a wet-etching method. By this etching process, however, an etchant solution enters into the recessed portion 27. As a result, the recess is enlarged, and, in the worst case, the gate electrode 28 breaks at the portion 34.
2. By anodizing after the aluminum film 28 is patterned, the surface of the patterned gate electrode 28 is oxidized. During the anodizing, however, the electrolyte solution enters into the recessed portion 27 to oxidize the portion 34 from the gate electrode side. Consequently, the gate electrode 28 increases its resistance and further becomes insulated.

The defects of TFT are supposed often to occur by the combination of these reasons. The production of TFTs having a structure shown in FIGS. 2C to 2D faces reduction of a yield.

SUMMARY OF THE INVENTION

The object of this invention is to prevent the etching of the portion 27 during the patterning of the aluminum film 28 and to prevent the oxidation also at the recessed portion 27 during the anodization after this patterning, in the treatment shown in FIG. 2C.

A preferred mode of the invention is described using FIG. 1C. According to the invention, as typically illustrated in FIG. 1C, a titanium nitride film 17 is formed on a gate insulating film 16, and further an aluminum film 18 used as a gate electrode is formed on the film 16. Since the titanium nitride film 17 can be formed at an extremely high step coverage (difference level coating) using a sputtering method, the recess 151 is buried or covered by the film 17.

The reason for selecting the titanium nitride film is that the material has etching selectivity to aluminum film. In concrete terms, during the etching of aluminum film, the titanium nitride film is not etched, and during anodizing, the titanium nitride film is not oxidized. Accordingly, a film having those characteristics may be used in place of titanium nitride film independent of the conductivity and insulating property of the film. Examples of that type of material that exhibits a similar effect as the titanium nitride film and is useful in this invention are a metallic titanium film in which no nitrogen is added and a phosphorus-doped silicon film formed by low pressure CVD (LPCVD) method. That type of film may be formed at a thickness from 50 to 1000 Å, for example, a thickness from 50 to 500 Å. It is necessary to form the thin film in consideration of the thickness of gate insulating film and of gate electrode.

According to the invention, wiring containing mainly aluminum is formed with high reliability on an object having a convex portion. When an electrode or wiring containing mainly aluminum is formed by covering on or crossing over the object (for example, the active layer 14 in FIG. 1B) having a convex, the breakage of the wiring structured with the aluminum film 18 at the edge 15 of the convex portion can be prevented. Because the first film (for example, the titanium nitride film 17) exhibits an etching selectivity for the second film (for example, the aluminum film 18). This utilizes the characteristic that the first film is not etched or has a low etching rate during the etching of second film.

In particular, when a titanium nitride film is used as the first film, when an aluminum film is used as the second film, and when the surface of the aluminum film is oxidized during the anodization, the oxidation in the vicinity (the portion 152 of FIG. 1C) of edge root of the convex on the object from the object side can be prevented, and the defects caused by substantial breakage of the second film can be reduced.

Titanium nitride film is not etched by an aluminum etchant. Consequently, even when an etchant enters the recess 151 during the patterning of gate electrode and gate wiring, the etching of aluminum film 18 can be prevented.

Furthermore, in the anodizing after the patterning of aluminum film 18, even if the electrolyte solution enters the portion 151, the oxidization of the aluminum film 18 from the gate insulating film side can be prevented.

As described above, the breakage of the aluminum film can be prevented by forming on the gate insulating film an aluminum film used as the gate electrode, via a titanium nitride film.

DETAIL DESCRIPTION OF THE PREFERRED EMBODIMENTS

Figure 1A:
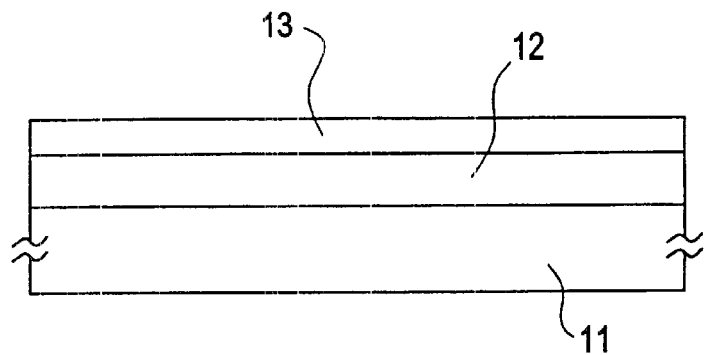
FIGS. 1A to 1D show the procedure for producing a TFT of an embodiment of this invention.
Figure 1B:
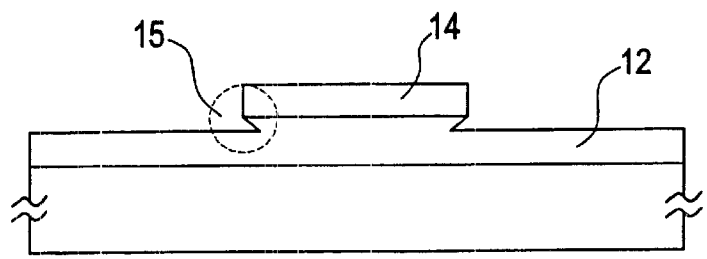

FIGS. 1A to 1D illustrate the procedure for producing an N-channel thin film transistor (TFT) of an embodiment of this invention. Although the embodiment describes the production procedure for an N-channel TFT, a P-channel TFT may be applied for this invention. The TFT of the embodiment is applicable for TFTs formed at a peripheral circuit or at a pixel area in a liquid crystal display unit, and further for TFTs in integrated circuits.

The silicon oxide film 12 as the base film is formed at a thickness of 2000 Å on the glass substrate 11 using a sputtering method. The amorphous silicon film 13 is formed at a thickness of 1000 Å by plasma CVD method. The formed silicon film 13 is crystallized by heating, irradiating laser beam, irradiating intense light, etc. A crystalline silicon film may be formed directly by vapor deposition method instead of the amorphous silicon film 13, and the amorphous film may be left non-crystallized. The element separation patterning is conducted to form the active layer 14. The active layer 14 has the source/drain regions and the channel forming region of TFT. During the element separation patterning, a mask is placed on the crystallized silicon film 13 to perform anisotropic dry etching by the reactive ion etching (RIE) method. However, it is technically difficult to stop the dry etching at the surface of the base film 12, and the etching actually proceeds into the base film 12. In particular, the edge of the active layer 14 is notched, and the etching also proceeds in the horizontal direction. As a result, the portion 15 produces.

Figure 1C:
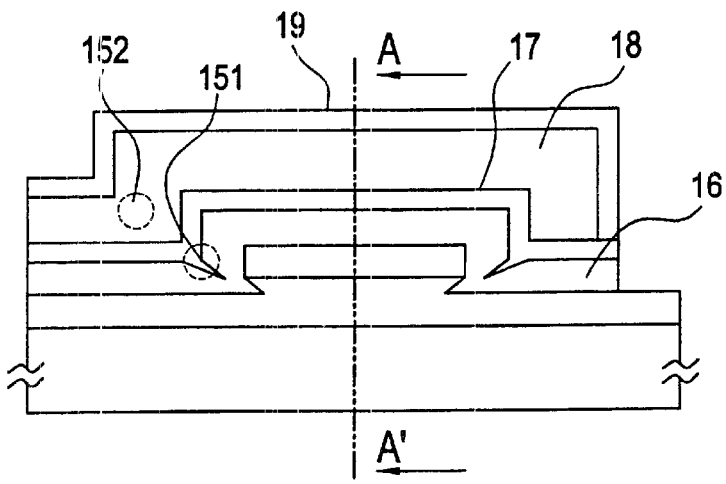

The silicon oxide film 16 as the gate insulating film is formed at a thickness of 1000 Å by a sputtering method. As seen in FIG. 1C, a recess directed towards the active layer 14 is formed in the silicon oxide film 16.

It is useful to improve the characteristics of the interface between the silicon oxide film 16 and the silicon film 14 used as the active layer by radiation of intense light after the silicon oxide film 16 is formed. As an example of the intense light, infrared light having a peak wave length of 1.3 μm can be used. Radiation of such infrared light reduces the interface level between the silicon film 14 and the silicon oxide film 16.

The next process is to form the titanium nitride film 17 at a thickness of, for example, 500 Å in a range of from 50 to 1000 Å by a sputtering method. The sputtering method may be sputtering of a titanium nitride target by argon molecules or sputtering of a titanium by nitrogen molecules. The conditions of the sputtering are: a pressure of 3×10-3 Torr, RF power of 200 W, heating temperature of 200° C.

The titanium nitride film 17 is formed to bury or cover the recessed portion 151 on the silicon oxide film 16. Then, the aluminum film 18 is formed. The aluminum film 18 is patterned by a wet etching method. A mixed acid aluminum solution is used in the patterning to selectively etch only the aluminum film 18. Since the titanium nitride film 17 is not almost etched, the recess portion 151 does not enlarge. For the smooth operation of the succeeding anodization, one or more of the elements selected from scandium, palladium, and silicon is added to the aluminum film 18 at 1 to 5% by weight.

The titanium nitride film 17 is etched with an aqueous ammonia ($NH_3OH/H_2O_2/H_2O$) using the patterned aluminum film 18 as a mask. During the treatment, the titanium nitride film 17 is selectively etched. Then, the oxide layer 19 is formed on the surface of the aluminum film 18, as the gate electrode patterned by anodization. In the anodization, the electrolyte solution of ethylene glycol containing tartaric acid (3% by weight) and ammonia water (5% by weight) is used. The thickness of the oxide layer formed by the treatment can be controlled by adjusting the applied voltage and the oxidation time.

During the anodization, even if the electrolyte solution enters the recessed portion 151, the portion 152 is not oxidized from the side of the gate insulating film 16. Accordingly, the portion 152 becomes an insulator and breaking of the aluminum film 18 as the gate electrode can be prevented.

Figure 1D:
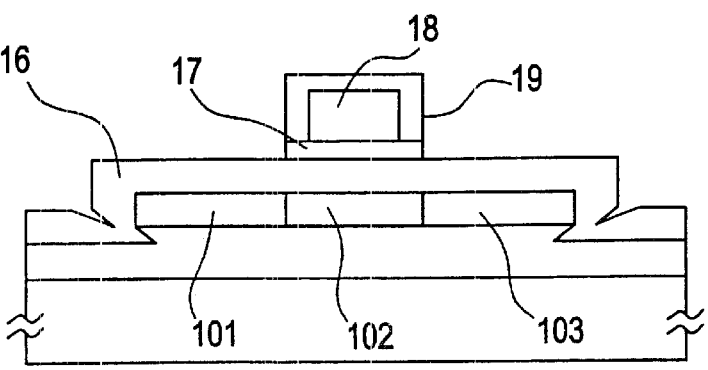
Figure 2A:
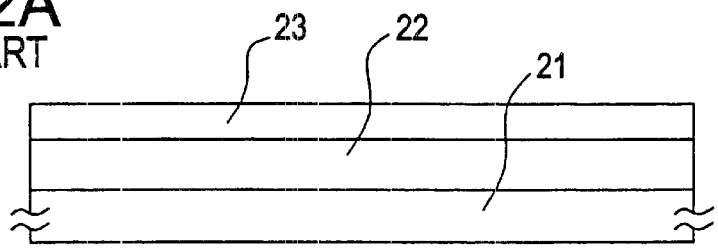
FIGS. 2A to 2D show the procedure for producing a common TFT.
Figure 2B:
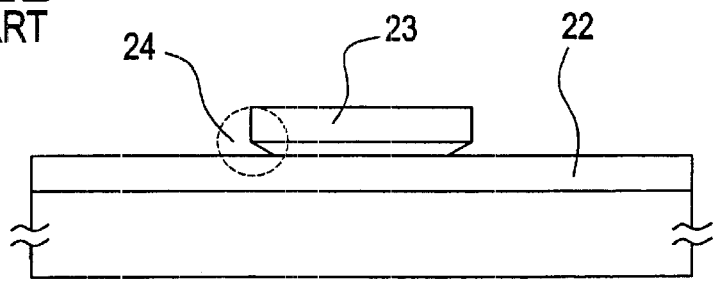
Figure 2C:
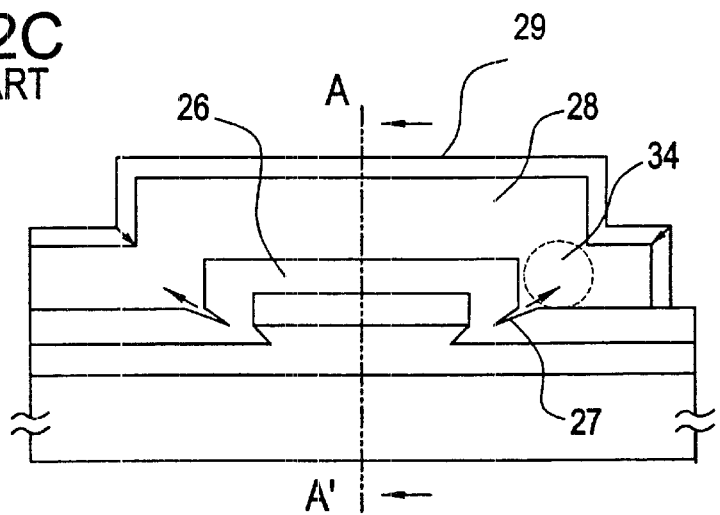
Figure 2D:
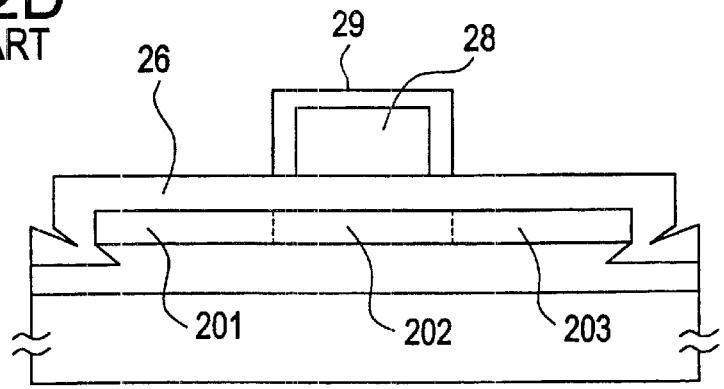
Figure 3:
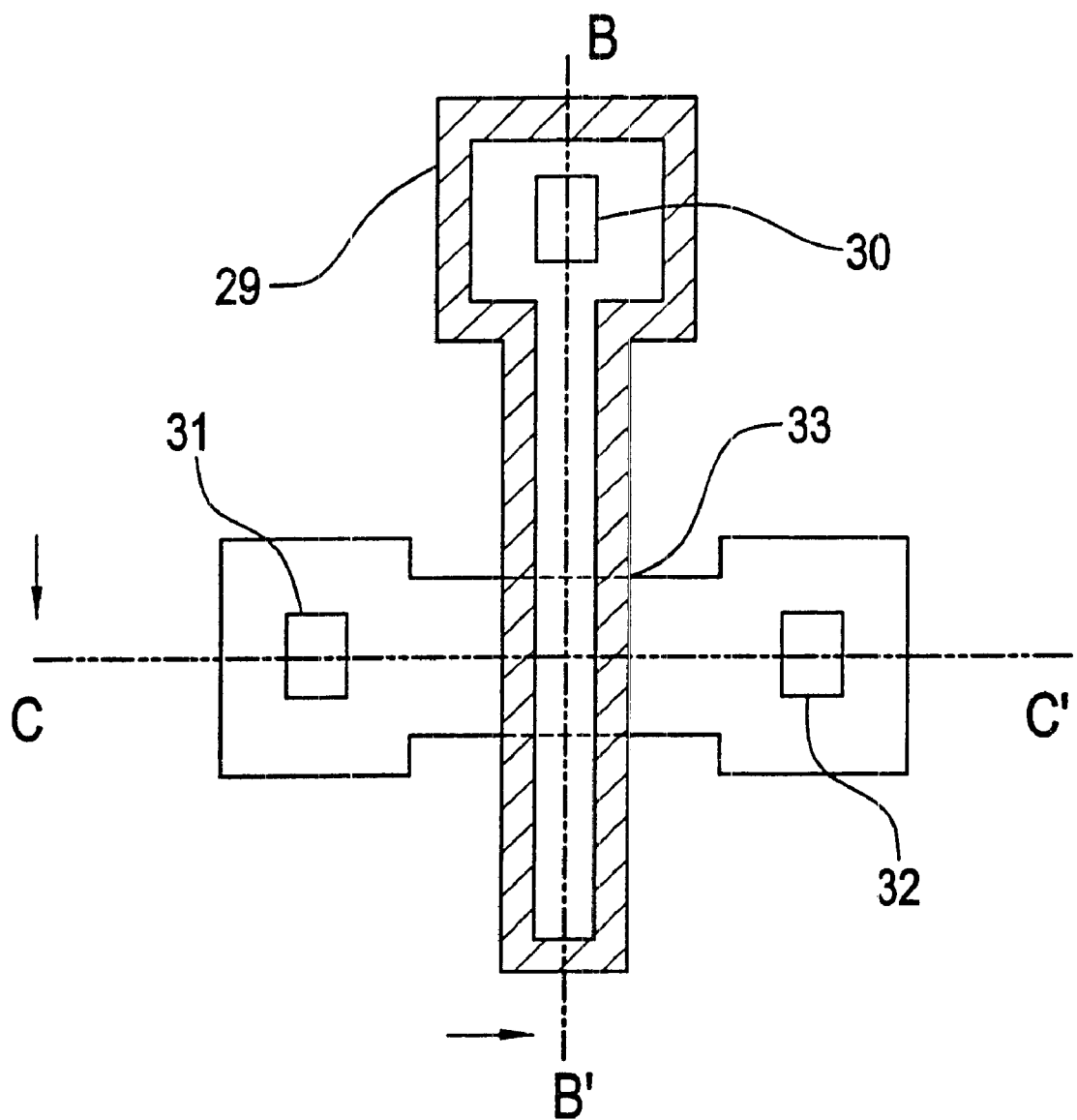
FIG. 3 shows a plan view of the structure of TFT in FIGS. 2C and 2D.
Figure 4:
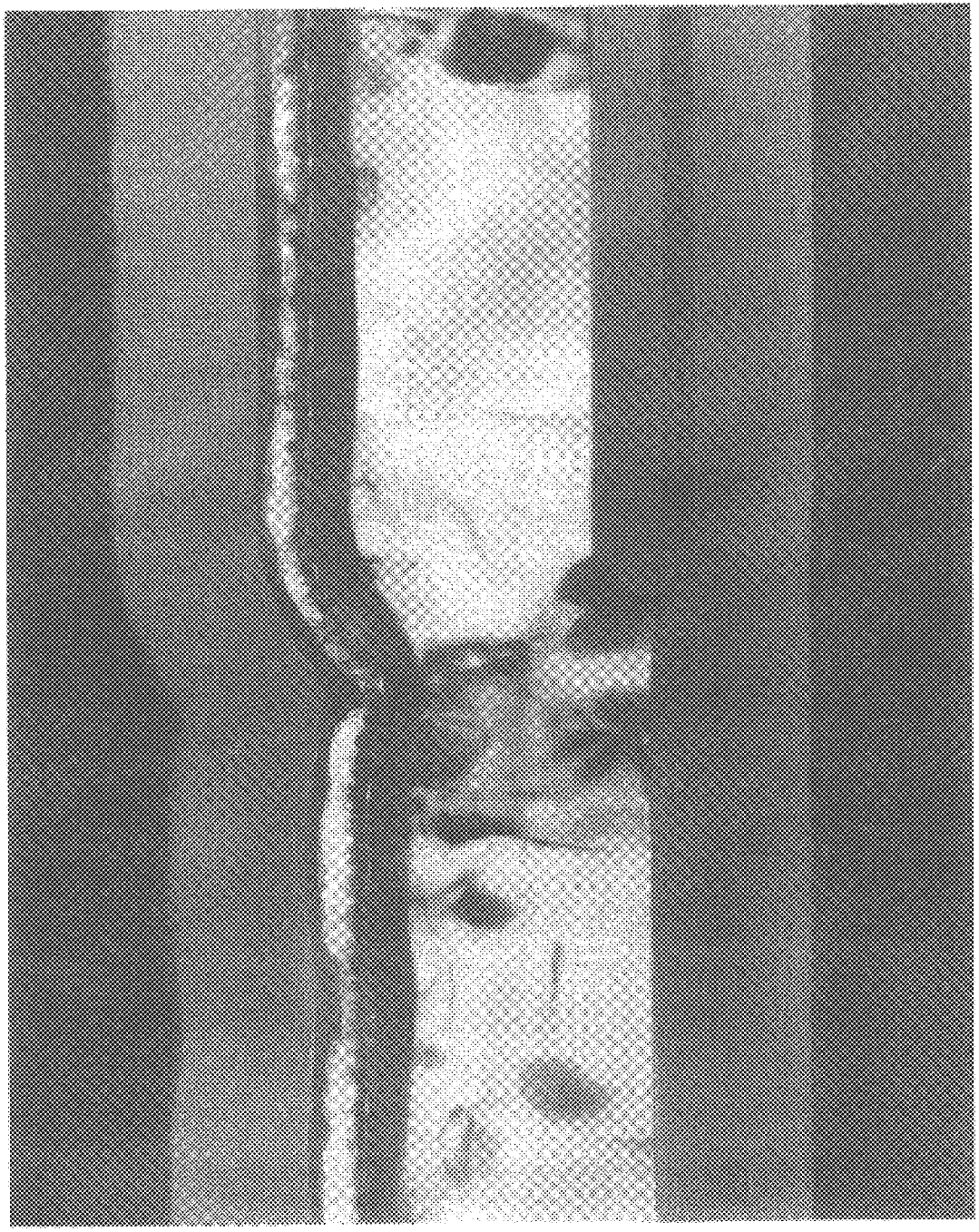
FIG. 4 is a photograph showing a cross section of the thin film in FIG. 2C.

FIG. 1D shows the A–A' cross section of FIG. 1C. The gate electrode 18 and the oxide layer 19 are used as the mask to perform the phosphorus (P) ion implantation. In the ion implantation, phosphorus ions are implanted into the regions 101 and 103, and the source/drain regions 101 and 103 and the channel forming region 102 are formed in a self-aligning manner. In this process, the thickness of the oxide layer 19 formed during the anodization allows to form an offset gate region. The activation of the source/drain regions 101 and 103 is performed by radiation of laser light or intense light.

During the activation treatment (annealing), it is useful to apply rapid thermal annealing (RTA) using infrared light as the intense light. The annealing method utilizes the selective absorption of infrared light to the silicon film, to heat the silicon film up to 1000 to 1200° C. within a short time.

The film formation of interlayer insulators, the patterning for opening holes, and the formation of source/drain electrode and gate electrode are performed to complete the production of TFT, though these processes are not shown in the figures.

When the titanium nitride film is formed on the gate insulating film, and when the aluminum film is formed on the titanium nitride film, the succeeding patterning of the aluminum film does not induce the etching of the aluminum film at the edge of the active layer from the gate insulating film side. Furthermore, during the formation of the oxide layer in the anodization, the progress of the oxidation of the aluminum film from the gate insulating film side is suppressed. Consequently, the substantial breakage of the gate wiring is prevented, and a TFT with a high reliability is produced.

What is claimed:

1. A method of manufacturing an insulated gate field effect transistor, said method comprising the steps of:

forming a semiconductor island formed on an insulating surface,;

forming a gate insulating film on and in direct contact with the semiconductor island, said gate insulating film including silicon oxide;

forming a metal nitride film on and in direct contact with the gate insulating film;

forming a metal film on and in direct contact with the metal nitride film; and forming a source region, a drain region and a channel region in the semiconductor island, wherein the metal nitride film extends beyond edges of the semiconductor island.

2. A method according to claim 1, wherein the metal nitride is a titanium nitride film.

3. A method according to claim 1, wherein the metal nitride film has a thickness in a range of 50 to 1000 Å.

4. A method according to claim 1, wherein the metal film is an aluminum film.

5. A method according to claim 1, further comprising the step of:

irradiating the semiconductor island with a light.

6. A method according to claim 5, wherein the light is an infrared light.

7. A method of manufacturing a thin film transistor, said method comprising the steps of:

forming a semiconductor island on an insulating surface;

forming a gate insulating film on and in direct contact with the semiconductor island, said gate insulating film including silicon oxide;

forming a gate electrode on the gate insulating film, said gate electrode including a metal nitride film and a metal film;

said metal nitride film being formed on and in direct contact with the gate insulating film;

said metal film being formed on and in direct contact with the metal nitride film; and forming a source region, a drain region and a channel region in the semiconductor island, wherein the metal nitride film extends beyond edges of the semiconductor island.

8. A method according to claim 7, wherein the metal nitride is a titanium nitride film.

9. A method according to claim 7, wherein the metal nitride film has a thickness in a range of 50 to 1000 Å.

10. A method according to claim 7, wherein the metal film is an aluminum film.

11. A method according to claim 7, further comprising the step of:

irradiating the semiconductor island with a light.

12. A method according to claim 7, wherein the light is an infrared light.

* * * * *